United States Patent
Huang et al.

(10) Patent No.: US 11,422,188 B2
(45) Date of Patent: Aug. 23, 2022

(54) ISOMETRIC CONTROL DATA GENERATION FOR TEST COMPRESSION

(71) Applicant: Mentor Graphics Corporation, Wilsonville, OR (US)

(72) Inventors: Yu Huang, West Linn, OR (US); Janusz Rajski, West Linn, OR (US); Sylwester Milewski, Nowe Miasto Lubawskie (PL)

(73) Assignee: Siemens Industry Software Inc, Plano, TX (US)

(*) Notice: Subject to any disclaimer, the term of this patent is extended or adjusted under 35 U.S.C. 154(b) by 0 days.

(21) Appl. No.: 16/360,223

(22) Filed: Mar. 21, 2019

(65) Prior Publication Data

US 2019/0293717 A1  Sep. 26, 2019

Related U.S. Application Data

(60) Provisional application No. 62/646,503, filed on Mar. 22, 2018.

(51) Int. Cl.
*G01R 31/3185* (2006.01)
*G01R 31/3183* (2006.01)

(52) U.S. Cl.
CPC ........ *G01R 31/318544* (2013.01); *G01R 31/318335* (2013.01); *G01R 31/318536* (2013.01); *G01R 31/318547* (2013.01)

(58) Field of Classification Search
CPC ........ G01R 31/318544; G01R 31/318536
See application file for complete search history.

(56) References Cited

U.S. PATENT DOCUMENTS

| | | |
|---|---|---|
| 6,327,687 B1 | 12/2001 | Rajski et al. |
| 6,353,842 B1 | 3/2002 | Rajski et al. |
| 6,539,409 B2 | 3/2003 | Rajski et al. |
| 6,543,020 B2 | 4/2003 | Rajski et al. |
| 6,557,129 B1 | 4/2003 | Rajski et al. |
| 6,684,358 B1 | 1/2004 | Rajski et al. |
| 6,708,192 B2 | 3/2004 | Rajski et al. |
| 6,829,740 B2 | 12/2004 | Rajski et al. |
| 6,874,109 B1 | 3/2005 | Rajski et al. |
| 7,093,175 B2 | 8/2006 | Rajski et al. |
| 7,111,209 B2 | 9/2006 | Rajski et al. |
| 7,260,591 B2 | 8/2007 | Rajski et al. |

(Continued)

OTHER PUBLICATIONS

A. Kumar, et. al., "Isometric test compression," IEEE Trans. CAD, vol. 34, pp. 1847-1859, Nov. 2015.

(Continued)

*Primary Examiner* — Joseph D Torres

(57) ABSTRACT

The operational mode information and the hold-toggle pattern for a flexible isometric test compression system may be determined based on the plurality of test cubes generated for a subset of the targeted faults, the predetermined size and toggle rate for the hold-toggle pattern, and the predetermined maximum number of device inputs for full-toggle scan chains. The operational mode information comprising information of the full-toggle scan chains may be determined based on reduced toggle ranges first and the hold-toggle pattern may then be determined using a relaxation method. Alternatively, the hold-toggle pattern and the full-toggle scan chains may be determined incrementally together.

28 Claims, 17 Drawing Sheets

Flow chart 700

(56) References Cited

U.S. PATENT DOCUMENTS

| | | | |
|---|---|---|---|
| 7,263,641 B2 | 8/2007 | Rajski et al. | |
| 7,478,296 B2 | 1/2009 | Rajski et al. | |
| 7,493,540 B1 | 2/2009 | Rajski et al. | |
| 7,500,163 B2 | 3/2009 | Rajski et al. | |
| 7,506,232 B2 | 3/2009 | Rajski et al. | |
| 7,509,546 B2 | 3/2009 | Rajski et al. | |
| 7,523,372 B2 | 4/2009 | Rajski et al. | |
| 7,653,851 B2 | 1/2010 | Rajski et al. | |
| 7,877,715 B1 * | 1/2011 | Thirunavukarasu | G01R 31/318533 714/727 |
| 7,886,263 B1 * | 2/2011 | Thirunavukarasu | G01R 31/318583 716/119 |
| 8,615,692 B1 * | 12/2013 | Khurana | G01R 31/318575 702/60 |
| 2010/0188096 A1 * | 7/2010 | Waayers | G01R 31/318541 324/537 |
| 2014/0082421 A1 * | 3/2014 | Marinissen | G01R 31/318575 714/34 |
| 2015/0253385 A1 * | 9/2015 | Rajski | G01R 31/318547 714/738 |

OTHER PUBLICATIONS

J. Rajski, J. Tyszer, M. Kassab, and N. Mukherjee, "Embedded deterministic test," IEEE Trans. CAD, vol. 23, pp. 776-792, May 2004.

D. Czysz, G. Mrugalski, J. Rajski, and J. Tyszer, "New test data decompressor for low power applications," Proc. DAC, 2007, pp. 539-544.

* cited by examiner

|    | Conventional scan | | | Designs with EDT logic | | Hypercompression (HTL) | |
|----|---|---|---|---|---|---|---|
|    | Sequential | Combinational | Total | Total | $\Delta_s$ | Total | $\Delta_H$ |
| C1 | 462,205 (0.54) | 724,627 (0.85) | 1,186,839 (1.39) | 1,197,765 (1.40) | 0.92% | 1,200,893 (1.41) | 1.18% |
| C2 | 749,037 (0.88) | 1,057,120 (1.24) | 1,806,157 (2.12) | 1,812,503 (2.13) | 0.35% | 1,814,766 (2.13) | 0.48% |
| C3 | 213,204 (0.25) | 71,419 (0.08) | 284,623 (0.33) | 286,439 (0.33) | 0.64% | 287,191 (0.34) | 0.90% |
| C4 | 713,196 (0.83) | 1,614,419 (1.89) | 2,327,615 (2.72) | 2,335,625 (2.73) | 0.34% | 2,338,450 (2.74) | 0.46% |

FIG. 6

Flow chart 800

ISOMETRIC CONTROL DATA GENERATION FOR TEST COMPRESSION

RELATED APPLICATIONS

This application claims the benefit of U.S. Provisional Patent Application No. 62/646,503, filed on Mar. 22, 2018, titled "Isometric Control Data Generation For Test Compression," and naming Yu Huang et al. as inventors, which application is incorporated entirely herein by reference.

FIELD OF THE DISCLOSED TECHNIQUES

The presently disclosed techniques relates to circuit testing. Various implementations of the disclosed techniques may be particularly useful for increasing test compression ratio while reducing test power dissipation.

BACKGROUND OF THE DISCLOSED TECHNIQUES

Test data compression has become instrumental in reducing the overall cost of test. Typically, this technology deploys an external tester to deliver compressed test patterns through a small number of channels, and on-chip decompressors to expand them into scan-compatible data. The first test compression schemes, such as broadcast scan, Illinois scan, Virtual Scan, or adaptive scan, do not make a distinction between ATPG (Automatic Test Pattern Generation) and compression. They work with hardwired decompressors defining either temporary or permanent equivalence of scan cells. Consequently, if a scan cell is assigned by ATPG, its value is copied to all equivalent scan cells, which effectively eradicates a separate encoding phase. The next-generation solutions, such as combinational compression and static as well as dynamic LFSR (Linear Feedback Shift Register) reseeding, use a variety of techniques to encode ATPG-produced partially specified test cubes. For example, the embedded deterministic test (EDT) employs a solver of linear equations to derive compressed data (seeds). Early test generation techniques within this class are unaware of a decompressor architecture and its implications on ATPG performance. One of the first steps to change this trend was to combine LFSR seed computation with ATPG-based justification of certain decision nodes.

To reduce test power dissipation, test data encoding schemes should also allow test patterns with low switching activity to be loaded to scan chains. If don't-care bits are filled with random values, then scan toggling can consume much more power than a circuit is rated for. Similarly, the bulk of test power consumption can also be attributed to capture and unloading of test responses. As a result, the power dissipation in the test mode can increase by a factor of 2 to 3 compared to the functional mode, and is only expected to worsen, leading to supply voltage noise or overheating. This can cause a device malfunction, loss of yield, chip reliability degradation, shorter product lifetime, or a device permanent damage.

With the exception of test data reduction, the performance characteristics of low-power test solutions are very different. Some schemes rely on enhanced LFSR reseeding techniques. For example, outputs of two LFSRs can be AND-ed or OR-ed to decrease the amount of switching. Test cubes can also be divided into blocks, and only those with transitions encoded by reseeding. Alternatively, one can freeze a decompressor in certain states and load scan chains with patterns having low transition counts. A low power decompressor used in parallel with a power-aware controller allows further reduction of scan toggling. Several solutions adapted by low-power compression schemes have debuted as stand-alone methods. Typically, they assign non-random values to unspecified bits of test cubes which can otherwise cause power violations. Don't-care bits may also assume values minimizing the number of transitions during scan-in shifting. The resultant test sequences can be run-length encoded. As another option, a minimum transition fill may replicate the value of the most recent care bit. California scan and vector modification use similar techniques. A minimum transition fill scheme uses bit stripping to determine unspecified positions and fill them accordingly to reduce transitions. Other switching-aware filling techniques decrease the capture power by assigning unspecified bits with values that can minimize the number of transitions at the outputs of scan cells in the capture mode.

An isometric test data compression approach, described in A. Kumar, et al., "Isometric test compression," IEEE Trans. CAD, vol. 34, pp. 1847-1859, November 2015, enables more interactions between test generation (ATPG) and test encoding. If f is a test pattern fill rate, then this new paradigm attempts to elevate compression ratios to values well beyond 1/f, i.e., above what is achievable through the best conventional reseeding techniques. The isometric compression deploys an on-chip power-aware test data decompressor in conjunction with a compression-friendly ATPG. This allows loading scan chains with low-transition patterns while successfully encoding a significantly large number of specified bits.

The integration of the industrial test flow with the isometric compression has confirmed the predicted advantages, especially in terms of compression ratios and power consumption. Nevertheless, there are challenges in implementing certain parts of the original isometric decompressor in complex designs in new technology nodes. In particular, template (control) registers used for original isometric decompressor need to match the size of the longest scan chains comprising hundreds of flip-flops. Because of this size, the template registers can only be reloaded with extra regular patterns. To justify this cost, both in terms of test data volume and test time, every single template has to be reused for many patterns. This, in turn, reduces flexibility of the isometric compression. Since the scheme works exclusively with low-power patterns affecting all scan chains, it may also compromise test coverage, if some faults need individually elevated fill rates in certain scan chains, which test templates may not be able to guarantee.

BRIEF SUMMARY OF THE DISCLOSED TECHNIQUES

Various aspects of the disclosed technology relate to generating isometric control data for test compression. In one aspect, there is a method, executed by at least one processor of a computer, comprising: generating a test cube for each of a plurality of faults to obtain a plurality of test cubes; determining operational mode information and a hold-toggle pattern based on the plurality of test cubes, predetermined size and toggle rate for the hold-toggle pattern, and a predetermined maximum number of device inputs for full-toggle scan chains (scan chains operating in a full-toggle mode), wherein the operational mode information determines which scan chains in the scan chains to be the full-toggle scan chains and which scan chains in the scan chains to be hold-toggle scan chains (scan chains operating in a hold-toggle mode) during a shift period, wherein the hold-toggle pattern determines in which shift clock cycles in a segment of consecutive shift clock cycles the hold-toggle scan chains receive bits based on corresponding bits of a test pattern during the shift period, wherein the hold-toggle pattern repeats multiple times during the shift period, the shift period being a period when the test pattern is being shifted into scan chains, and wherein the device inputs are inputs of a device coupled to the scan chains and configured to allow a small number of input lines to feed a large number of the scan chains; and generating test patterns based on the operational mode information and the hold-toggle pattern. The plurality of faults may be a subset of originally targeted faults.

The method may further comprise: performing fault simulations to determine, based on whether there are still faults left in originally targeted faults not detectable by the test patterns, whether to repeat the generating test cubes, the determining operational mode information and a hold-toggle pattern, and the generating test patterns.

The determining operational mode information and a hold-toggle pattern may comprise: determining the full-toggle scan chains based on toggle ranges for each of the plurality of test cubes; and determining the hold-toggle pattern using a relaxation algorithm and based on the full-toggle scan chains, the plurality of test cubes, and the predetermined size and toggle rate for the hold-toggle pattern. The determining the full-toggle scan chains may comprise: determining the toggle ranges for each of the scan chains for the each of the test cubes; determining chain-reduced toggle ranges by combining the toggle ranges for each of the scan chains for the each of the test cubes based on the predetermined size for the hold-toggle pattern; determining reduced toggle ranges for the each of the test cubes by combining the chain-reduced toggle ranges based on the predetermined toggle rate for the hold-toggle pattern; and determining the full-toggle scan chains based on scan chains of which the chain-reduced toggle ranges cannot be combined into the reduced toggle ranges due to the predetermined toggle rate for the hold-toggle pattern and the number of device inputs available for full-toggle scan chains.

Alternatively, the determining operational mode information and a hold-toggle pattern may comprise: determining the hold-toggle pattern using a relaxation algorithm and based on the plurality of test cubes and the predetermined size and toggle rate for the hold-toggle pattern. The determining the hold-toggle pattern may comprise: replacing test cubes having conflicts with a selected intermediate hold-toggle pattern generated by the relaxation algorithm with test cubes generated based on the selected intermediate hold-toggle pattern. The determining operational mode information and a hold-toggle pattern may further comprise: determining the full-toggle scan chains based on test cubes having conflicts with an intermediate hold-toggle pattern selected by the relaxation algorithm and the number of device inputs available for full-toggle scan chains. The determining the full-toggle scan chains may comprise: ranking scan chains based on the test cubes having conflicts with the selected intermediate hold-toggle pattern; and using the ranked scan chains and the number of device inputs available for full-toggle scan chains to determine the full-toggle scan chains. The determining the hold-toggle pattern may comprise: selecting an intermediate hold-toggle pattern from intermediate hold-toggle patterns generated by the relaxation algorithm based on a specified bits-related cost function.

The device may be an expander in a decompressor. The predetermined size for the hold-toggle pattern may be 40 bits or fewer, the predetermined toggle rate for the hold-toggle pattern may be two times the scan chain shift toggle rate limit, and the predetermined maximum number of device inputs for the full-toggle scan chains may be 2.

The generating test patterns may comprise generating compressed test patterns. The compressed test patterns may be test patterns encoded for EDT (embedded deterministic test)-based decompressors.

In another aspect, there are one or more non-transitory computer-readable media storing computer-executable instructions for causing one or more processors to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 6 shows a table of the silicon real estate taken up by HTL in terms of equivalent area of 2-input NAND gates (measured also in $mm^2$) for 4 industrial circuits (C1-C4).

DETAILED DESCRIPTION OF THE DISCLOSED TECHNIQUES

General Considerations

Various aspects of the disclosed technology relate to generating isometric control data for test compression. In the following description, numerous details are set forth for the purpose of explanation. However, one of ordinary skill in the art will realize that the disclosed technology may be practiced without the use of these specific details. In other instances, well-known features have not been described in detail to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "determine" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
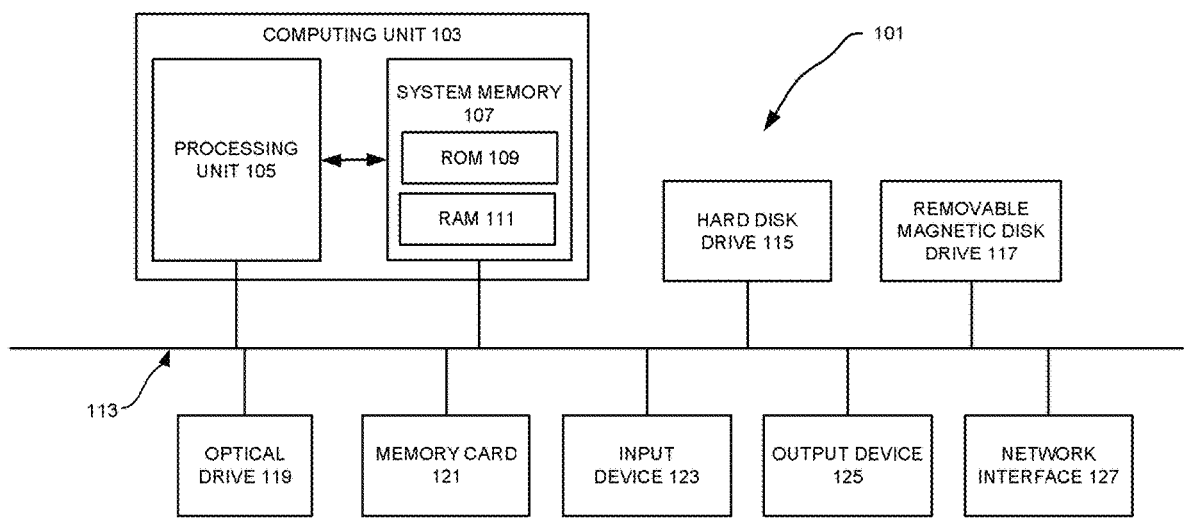
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multiprocessor computer, a plurality of single and/or multiprocessor computers arranged into a network, or some combination of both.

Design for Test, Test Pattern Generation, and Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-triggered flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353, 842; 6,539,409; 6,543,020; 6,557,129; 6,684,358; 6,708, 192; 6,829,740; 6,874,109; 7,093,175; 7,111,209; 7,260, 591; 7,263,641; 7,478,296; 7,493,540; 7,500,163; 7,506, 232; 7,509,546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Flexible Isometric Decompressor System

Figure 2:
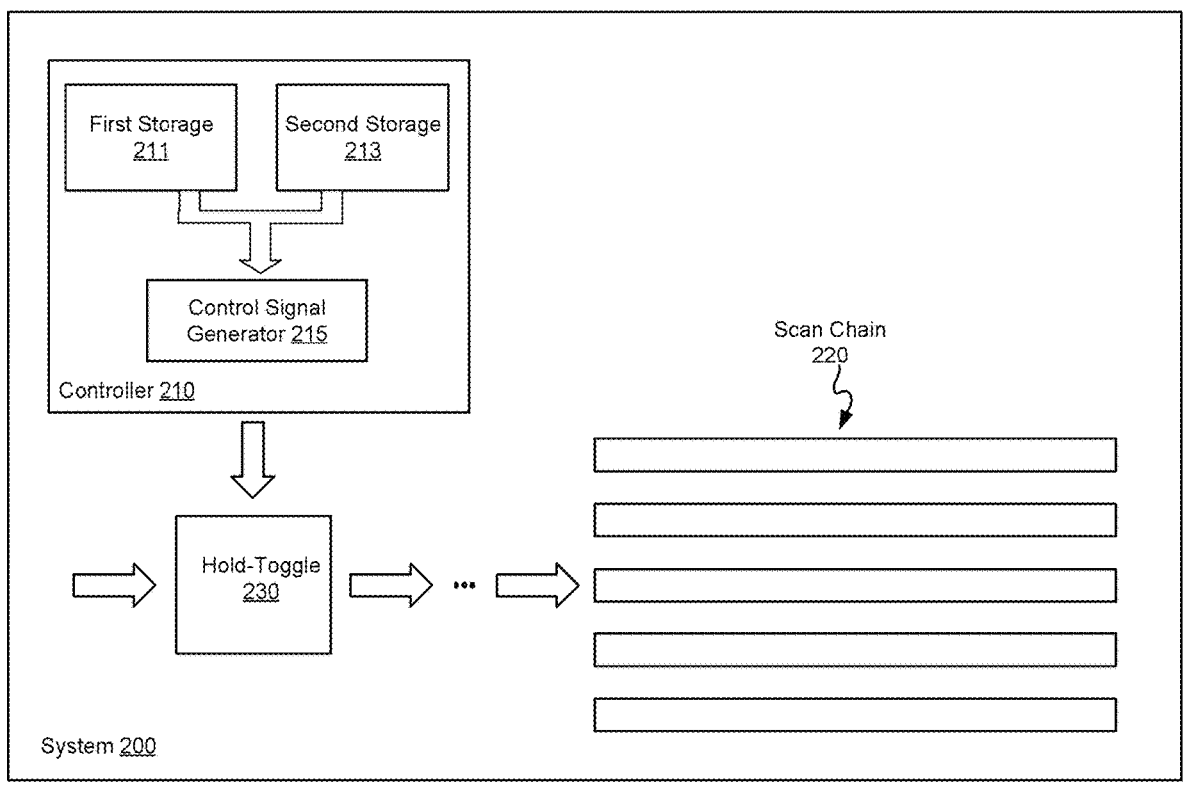
FIG. 2 illustrates an example of a test compression system 200 according to various embodiments of the disclosed technology.

FIG. 2 illustrates an example of a test compression system 200 according to various embodiments of the disclosed technology. The system 200 comprises a controller 210, scan chains 220, and hold-toggle circuitry 230. The scan chains 220, comprising scan cells, are configured in a test mode to shift in test patterns, apply the test patterns to the circuit, capture test responses of the circuit, and shift out the test responses. The controller 210 comprises first storage circuitry 211, second storage circuitry 213, and a control signal generator 215. The first storage circuitry 211 comprises circuitry for storing operational mode information. The operational mode information determines in which mode (a full-toggle mode or a hold-toggle mode) a scan chain operates when a test pattern is being shifted into the scan chains. A scan chain operating in the full-toggle mode receives bits based on corresponding bits of the test pattern. A scan chain operating in the hold-toggle mode receives bits based on corresponding bits of the test pattern (toggling) only in a predetermined number of inconsecutive shift clock cycles and constant bits (holding) in the rest of shift clock cycles for shifting the test pattern into the scan chains. The operational mode information may be delivered to the first storage circuitry 211 from an on-chip or off-chip storage place, or by a processor or by ATE.

The second storage circuitry 213 comprises circuitry for storing information of a hold-toggle pattern. The information of the hold-toggle pattern may be delivered to the second storage circuitry 213 from an on-chip or off-chip storage place, or by a processor or by ATE. The hold-toggle pattern determines in which shift clock cycles in a segment of consecutive shift clock cycles scan chains operating in the hold-toggle mode receive bits based on corresponding bits of the test pattern when a test pattern is being shifted into the scan chains. The hold-toggle pattern repeats multiple times during the scan shift period. For example, the longest scan chain has 600 scan cells. Accordingly, 600 shift clock cycles are needed to load a test pattern into the scan chains. The hold-toggle pattern covers 30 shift clock cycles and thus repeats 20 times during the scan shift period. The control signal generator 215 is configured to generate control signals based on the operational mode information and the hold-toggle pattern.

The hold-toggle circuitry 230 is configured to allow, according to the control signals received from the controller 210, some scan chains in the scan chains to operate in the full-toggle mode and some other scan chains in the scan chains to operate in the hold-toggle mode when the test pattern is shifted into the scan chains.

Figure 3:
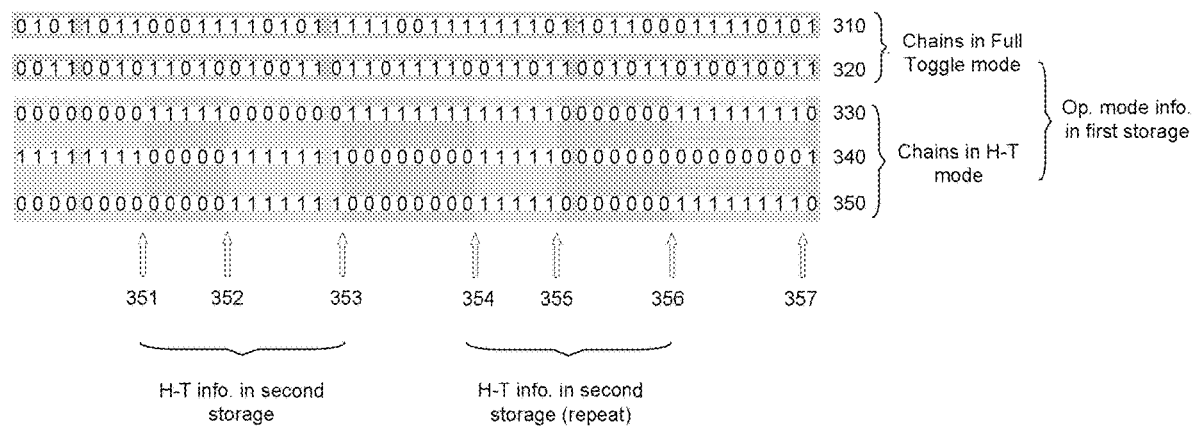
FIG. 3 illustrates an example of test pattern bits shifted into scan chains using the test compression system shown in FIG. 2.

FIG. 3 illustrates an example of test pattern bits shifted into scan chains using the system 200. Here, scan chains 310 and 320 operate in the full toggle mode whereas scan chains 330, 340, and 350 operate in the hold-toggle mode. As can be seen in the figure, bits in the scan chains 310 and 320 have no apparent regular patterns, changing according to the original test pattern. Those in the scan chains 330, 340, and 350, however, show consecutive "1s" alternating with consecutive "0s". The figure shows seven toggle points 351-357, where bits in the scan chains 330, 340, 350 may flip. Whether or not to flip depends on what is the next bit according to the original test pattern. If the upcoming bit is the same as the current one, then no toggle occurs such as the toggle point 354 on the scan chain 330, the toggle point 356 on the scan chain 340, and the toggle point 351 on the scan chain 350. Otherwise, the bit is flipped or inverted at the toggle points. Another feature shown in FIG. 3 is the three toggle points 351-353 form a set of toggle points, specifying a hold-toggle pattern along with the hold points. This hold-toggle pattern repeats itself for the next three toggle points 354-356. In fact, the last toggle point 357, like the toggle point 354, is a repeat of the toggle point 351.

Figure 4:
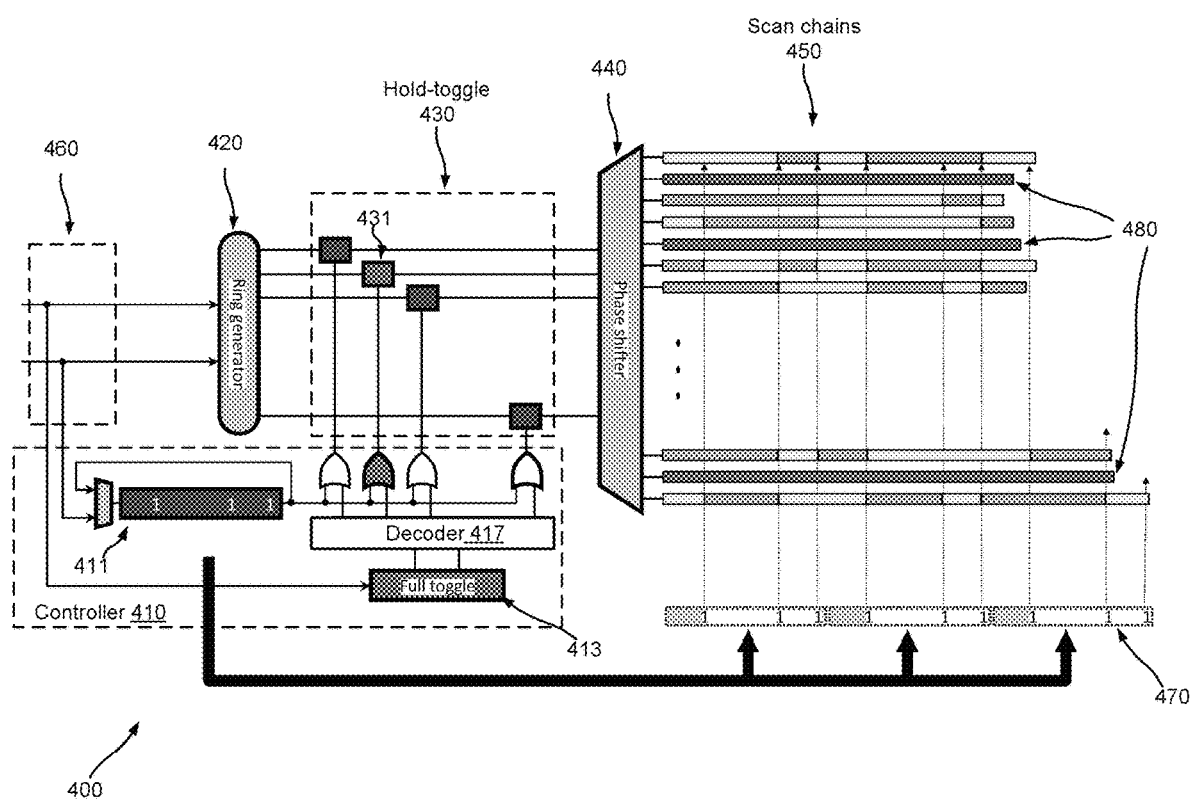
FIG. 4 illustrates an example of a block diagram of an EDT-based test compression system according to some embodiments of the disclosed technology.

FIG. 4 illustrates an example of a block diagram of an EDT-based test compression system 400 according to some embodiments of the disclosed technology. The EDT-based test compression system 400 comprises scan chains 450, a controller 410, hold-toggle circuitry 430, input circuitry 460, and a decompressor comprising a ring generator 420 and a phase shifter 440. The ring generator 420 may also be referred to as a continuous-flow ring generator. It can decode compressed test pattern data with every scan shift clock cycle. The phase shifter 440 can mix and expand outputs of the ring generator 420 to drive the scan chains 450. In the EDT-based system 400, the hold-toggle circuitry 430 is inserted between the ring generator 420 and the phase shifter 440. The hold-toggle circuitry 430 comprises subunits, of which each is coupled to an output of the ring generator 420 and is controlled by a control signal bit outputted by the controller 410. As noted previously, the subunit can be implemented by a latch with a multiplexer. Based on the control signal bit which may vary at some shift clock cycles, a subunit can either keep its content (hold) or be updated by the ring generator 420 (toggle). A time point when the ring generator 420 updates a subunit is called a toggle point. The controller 410 comprises a circular shift register 411 storing a hold-toggle pattern specifying the toggle points, a register 413 storing operational mode information, and a decoder 417 decoding the operational mode information. The outputs of the circular shift register 411 and the decoder 417 are combined by a set of OR gates to generate the control signal bits. The input circuitry 460 may comprise switching circuitry which connects inputs to the controller 410 when the input signals contain the hold-toggle pattern and/or the operational mode information or to the ring generator 420 when the input signals contain a compressed test pattern.

The small sizes of both the circular shift register 411 and the register 413 allow them to be updated frequently, even per pattern, without significantly affecting test time. For example, the input circuitry 460 may comprise state elements. The hold-toggle pattern and/or the operational mode information may be combined with compressed test pattern bits. If the longest scan chain needs 500 clock cycles to be fully loaded, the next four clock cycles may be used to load the state elements in the input circuitry 460 with the hold-toggle pattern and/or the operational mode information, which can then be transported to the controller 410 for controlling the loading of the next test pattern. Here, less than 1% of the shift clock cycles are allocated to loading the controller 460.

FIG. 4 also shows that a subunit 431 in the hold-toggle circuitry 430 is set to be "transparent"—allowing the corresponding output of the ring generator to feed the phase shifter 440 directly, and that the other subunits update their contents according to toggle points specified by the hold-toggle pattern. As such, three scan chains 480 operate in the full-toggle mode and the rest of the scan chains 450 operate in the hold-toggle mode. Between two successive toggle points is a hold segment. Locations of all toggle points form a test template, of which a portion (470) is illustrated in the figure. As can be seen, the hold-toggle pattern repeats three times in the portion of the test template 470.

It should be noted that the system 400 shown in FIG. 4 is just one example. A person of ordinary skill in the art will appreciate that various different configurations/circuits can be used to implement the system 400. For example, the ring generator may be replaced with an LFSR for LFSR-reseeding-based decompression, or a device comprising a plurality of multiplexers for broadcast-based decompression. The controller 410 may also comprise a second pair of decoder 417 and register 413 to allow two inputs of the phase shifter 440 to feed full-toggle scan chains.

A system according to various embodiments of the disclosed technology can shift low-entropy (low-toggling) test patterns into scan chains. Experimental evidences derived using some implementations of the disclosed technology indicate that it typically suffices to have at most two hold latches in the hold-toggle circuitry of the system operating in a transparent mode. This means about a dozen or less scan chains operate in the full-toggle mode during scan shift. A large design typically has a couple of hundred or even a few thousand scan chains. As a result, a large portion of the scan chains receive low toggling bit sequences, and power dissipation can be significantly reduced when a test pattern is shifted into the scan chains.

Figure 5:
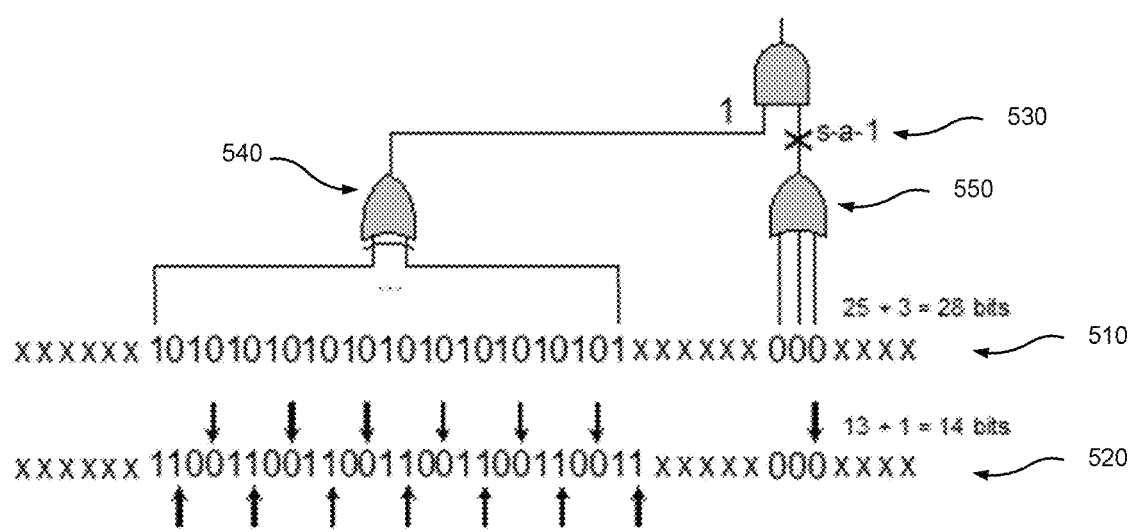
FIG. 5 illustrates an example of isomeric compression which may be implemented by various embodiments of the disclosed technology.

The disclosed technology can achieve high test compression even with low-entropy patterns. First, the number of care bits (specified bits) does not have to constrain neither compression nor a desired low toggling. On the contrary, having several cells assigned the same value and hosted by the same chain may actually ease problems related to both test data reduction and switching activity. Indeed, only specified bits occurring at certain locations would be then encoded in some of the compression schemes, while bits of the same value make it possible to deliver identical test data to scan chains for a number of shift cycles, thereby reducing the resultant toggling. FIG. 5 illustrates an example of isomeric compression which may be implemented by various embodiments of the disclosed technology. A test cube 510 detects a stuck-at-1 fault 530 by feeding a 25-input XOR gate 540 and a 3-input OR gate 550. Alternatively, one can apply a test cube 520. The number of specified bits that have to be encoded within the test cube 510 is equal to 25+3=28, whereas it suffices to target only 13+1=14 care bits to encode the test cube 520. Here, the specified pairs "00" and "11" can be obtained by encoding just the first value of each pair (indicated by arrows) and then sustaining the decompressor outputs to deliver the identical value during the next shift cycle.

As mentioned early, two new features of the disclosed technology further help to obtain a high degree of test compression. First, a small set of scan chains receive a full toggle stimulus, and a different test patterns can dynamically select different sets of full toggle scan chains. This prevents scenarios where certain faults escape detection (leading to a coverage drop) because they need more frequent changes in a given scan chain than the hold-toggle mode could permit.

Second, a short hold-toggle pattern repeating multiple times, rather than a full length hold-toggle template, is employed to control scan chains operating in the hold-toggle mode. In many cases, the short hold-toggle pattern can be less than 32 bits. Because of its size, a hold-toggle pattern can be deployed for any number of test patterns, including a single vector. This is because an update of a small test template register requires no additional patterns and/or ATE channels, and time needed to do this is a negligible fraction of a regular test pattern upload period. The dynamically changeable hold-toggle pattern makes ATPG and/or encoding more flexible and thus high compression feasible.

The disclosed technology can also achieve the benefits of low shift-power and high compression without significantly increasing test logic silicon real estate. As shown above, test logic (HTL) according to some embodiments of the disclosed technology can be implemented using one hold latch and one 3-input OR gate per a single bit of a ring generator. Furthermore, it comprises a template register, typically a 32-bit or smaller device, two $\log_2 n$-bit full toggle registers, where n is the number of scan chains, and two 1-out-of-n decoders using a certain number (depending on n) of 5-input AND gates and inverters. FIG. 6 shows a table of the silicon real estate taken up by HTL in terms of equivalent area of 2-input NAND gates (measured also in mm$^2$) for 4 industrial circuits (C1-C4). The presented numbers are computed with a commercial synthesis tool for four industrial circuits. All components of the test logic are synthesized using a 65 nm CMOS standard cell library under 2.5 ns timing constraint. The table reports the following quantities: the resultant silicon area with respect to combinational and sequential devices for conventional scan-based designs (the first three columns), the total area taken by circuits with on-chip EDT-based test compression, and then the percentage area increase (ΔE). Subsequently, the total HTL-based area is presented and compared with the corresponding area occupied by conventional scan-based designs (ΔH). The results do not account for a routing cost, however. Except for two signals to control template and full toggle registers, it remains similar to that of the conventional scan. As can be seen, the resultant area is comparable to other scan-based DFT methods. Testing with power constraints typically needs additional hardware for: activating a high-speed scan enable signal, moderating di/dt through a scan burst capability, gating scan cells to reduce power dissipation during shift, and gating scan out signal to reduce the power consumption during normal operations. Having the HTL logic on a chip may result in slightly more complicated designs with respect to the placement and routing, but, in turn, the disclosed technology can further reduce test data volume and power consumption, allowing for more efficient handling of new types of defects.

Isometric Control Data Generation

Figure 7:
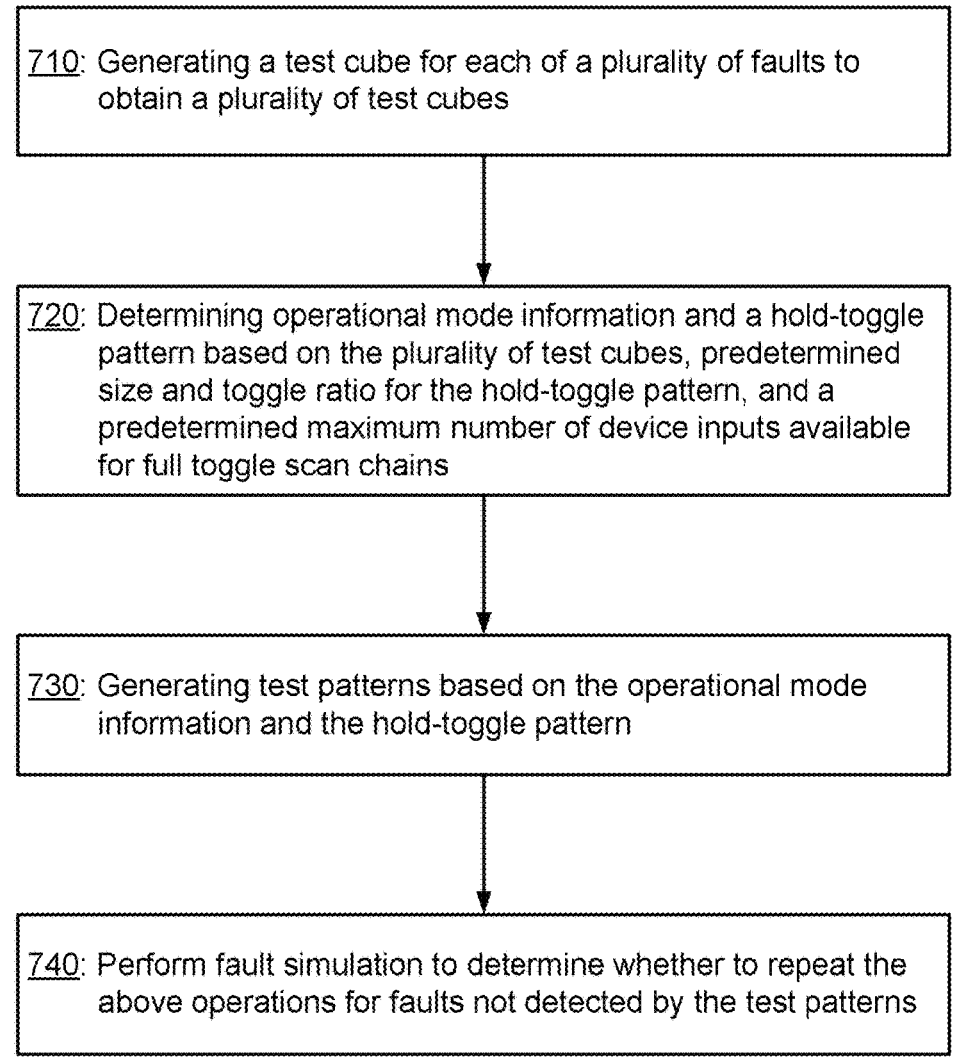
FIG. 7 illustrates a flowchart showing a process of isometric control data generation that may be implemented according to various examples of the disclosed technology.

FIG. 7 illustrates a flowchart 700 showing a process of isometric control data generation that may be implemented according to various examples of the disclosed technology. In operation 710, a test cube is generated for each of a plurality of faults to obtain a plurality of test cubes. The plurality of faults can be a subset of faults which are intended to be covered by a test set. As noted previously, a test cube is a test pattern in which only some of the bits are specified. Here, these specified bits for each of the plurality of test cubes are determined in a test pattern generation process for testing a particular fault. A commercial ATPG tool, such as those in the Tessent family of software tools available from Mentor Graphics Corporation, Wilsonville, Oreg., can be used to generate the plurality of test cubes.

In operation 720, isometric control data including operational mode information and a hold-toggle pattern are determined based on the plurality of test cubes, predetermined size and toggle rate for the hold-toggle pattern, and a predetermined maximum number of device inputs for full-toggle scan chains are determined. The device inputs are inputs of a device coupled to the scan chains, which has more outputs than inputs and configured to allow a small number of input lines to feed a large number of the scan chains. An example of the device is an expander, which can be a part of a decompressor. The phase shifter 440 in FIG. 4 is an example of the expander. The predetermined maximum number of device inputs for full-toggle scan chains may be set to be two. The predetermined size for the hold-toggle pattern may be set to be 40 bits or fewer. The predetermined toggle rate for the hold-toggle pattern may be set based on power dissipation requirement of the circuit design. If the power dissipation requirement specifies, for example, that the scan chain shift toggle rate should be lower than 25%, the toggle rate for the hold-toggle pattern can be set to be as high as 50%. The toggle rate represents a ratio of bits for toggling vs. bits for holding in the hold-toggle pattern. A bit for toggling in the hold-toggle pattern means, as indicated above, that scan chains receive bits based on corresponding bits of the test pattern. For a bit for toggling, on average, 50% of the scan chains may experience toggling (a transition from 1 to 0 or from 0 to 1) while the rest may experience no change of bits. This is why the toggle rate for the hold-toggle pattern can be set to be two times the scan chain shift toggle rate.

A full-toggle scan chain is a scan chain operating in the full-toggle mode and a hold-toggle scan chain is a scan chain operating in the hold-toggle mode. As noted previously, the operational mode information determines which scan chains in the scan chains are the full-toggle scan chains and which scan chains in the scan chains are hold-toggle scan chains; and the hold-toggle pattern determines in which shift clock cycles in a segment of consecutive shift clock cycles the hold-toggle scan chains receive bits based on corresponding bits of a test pattern during a shift period. The shift period is a period when the test pattern is being shifted into scan chains. The hold-toggle pattern repeats multiple times during the shift period as illustrated in FIGS. 3 and 4.

Figure 8:
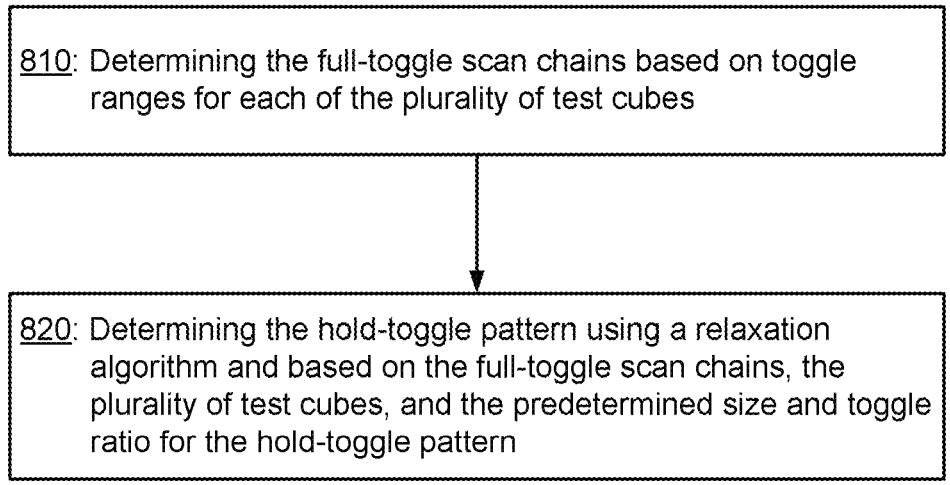
FIG. 8 illustrates a flowchart showing an example of a process for determining the operational mode information and the hold-toggle pattern that may be implemented according to various examples of the disclosed technology.
Figure 8:
Figures 9A, 9B:
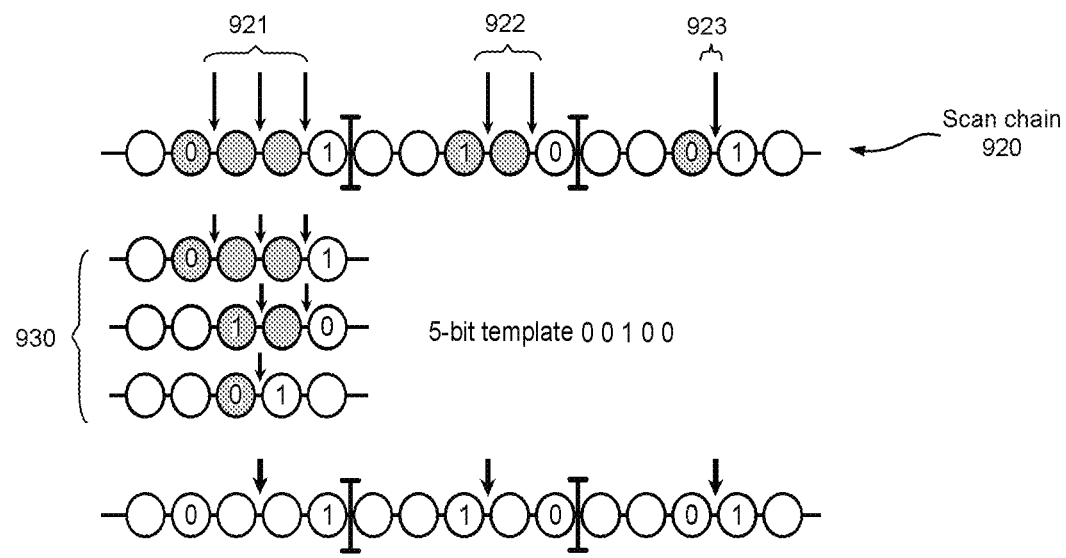
FIG. 9A illustrates examples of toggle ranges for a part of a test cube associated with a scan chain.
FIG. 9B illustrates an example for how to derive a chain-reduced toggle range from toggle ranges having overlaps (intersections).

FIG. 8 illustrates a flowchart 800 showing an example of a process for determining the operational mode information and the hold-toggle pattern that may be implemented for the operation 720 according to various examples of the disclosed technology. In operation 810, the full-toggle scan chains are determined based on toggle ranges for each of the plurality of test cubes. A toggle range for a scan chain is a sequence of locations between two consecutive different specified bits of a test cube, where a toggle point can be located. Here, the sequence of locations is associated with a sequence of scan cells on the scan chain. FIG. 9A illustrates examples of toggle ranges 911-914 for a part of a test cube 910 associated with a scan chain. The toggle range 911, for example, is between specified bits "1" and "0". These two bits and a don't care bit "x" (unspecified bit) will be loaded into three scan cells on a scan chain. A toggle point needs to occur in the toggle range 911 so that the specified bit "1" can be loaded to the target scan cell after the specified bit "0" is first shifted into it, assuming that the scan shift direction is from the left to the right. The toggle point can occur in one of two available toggle positions shown by arrows in the figure. Similarly, the toggle ranges 912, 913 and 914 have 4, 3 and 1 available toggle positions, respectively.

Figure 10:
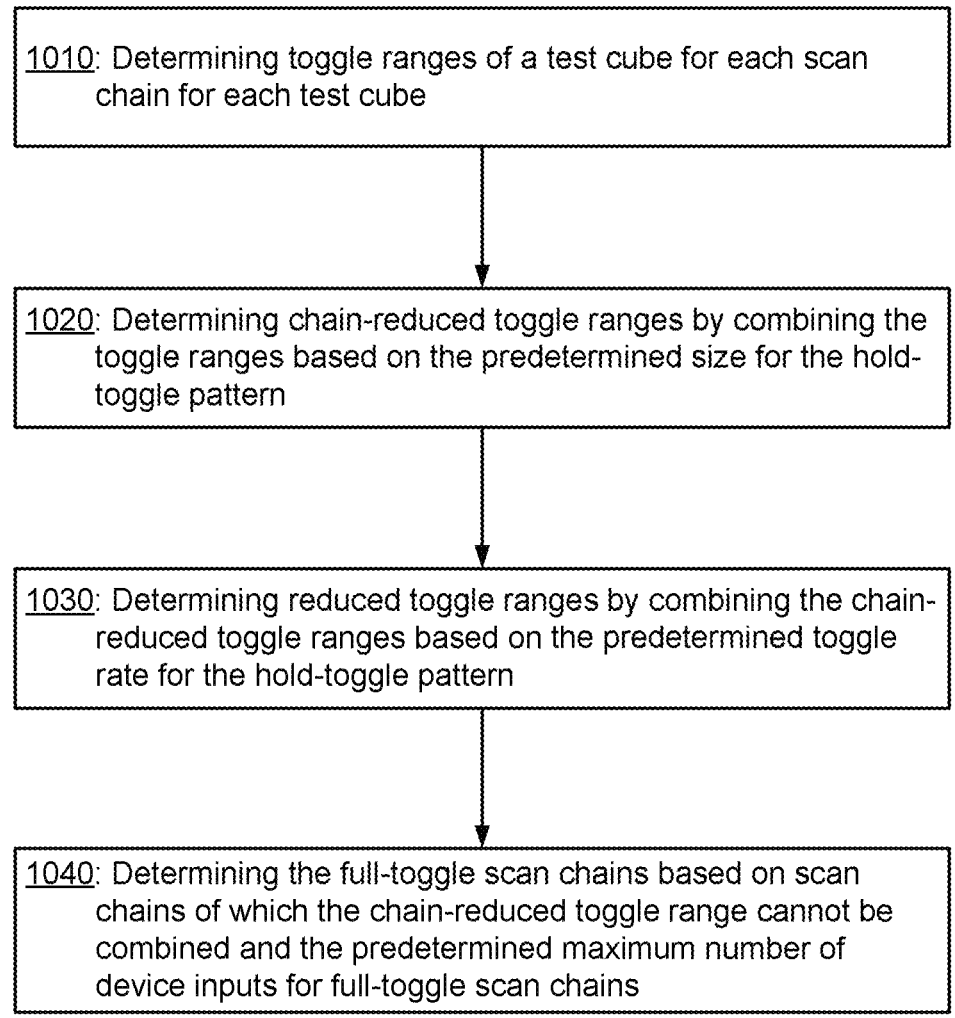
FIG. 10 illustrates a flowchart showing an example of a process for determining full-toggle scan chains base on the toggle ranges that may be implemented according to various examples of the disclosed technology.

FIG. 10 illustrates a flowchart 1000 showing an example of a process for determining the full-toggle scan chains base on the toggle ranges that may be implemented for the operation 810 according to various examples of the disclosed technology. In operation 1010, the toggle ranges for each of the scan chains for the each of the test cubes are determined. Let $v_1$ and $v_2$ be specified values of a test cube assigned to scan cells $c_1$ and $c_2$, respectively. All scan cells between $c_1$ and $c_2$ have don't care values. If $v_1 \neq v_2$, then the corresponding toggle range, denoted by [$c_1$, $c_2$), includes $c_1$ and all subsequent cells until $c_2$ which is, by definition, excluded in this notation. If scan cells are numbered from the left starting with 0, the toggle ranges 911-914 illustrated in FIG. 9A are denoted by: [2, 4), [8, 12), [18, 21), [26, 27), respectively.

In operation 1020, chain-reduced toggle ranges are determined by combining the toggle ranges based on the predetermined size for the hold-toggle pattern. FIG. 9B uses a simple example to illustrate for how to derive a chain-reduced toggle range from toggle ranges having overlaps (intersections). In the figure, a scan chain 920 is shown to be loaded with specified bits of a test cube. These specified bits lead to three toggle ranges (921, 922, and 923): [1, 4), [7, 9), and [12, 13). The hold-toggle pattern has five bits, so the scan chain 920 is divided into five-bit equal sections. By arranging them in a column 930, it is easy to see that the three toggle ranges 921, 922, and 923 have overlaps and that their common intersection is [2, 3), which is the chain-reduced toggle range for the scan chain 920.

A computer may implement the above reduction process by changing the representation of a toggle range from [x, y) to [x mod s, y mod s) (if a toggle range is larger than s, it will be ignored), and then computing common intersections in a pairwise fashion. If a toggle range does not have an overlap with any other toggle ranges, it becomes one of the chain-reduced toggle ranges on its own. Therefore, a scan chain can have a group of chain-reduced toggle ranges (or sometimes just one chain-reduced toggle range) for a test cube, including any toggle ranges having no overlaps with other toggle ranges, non-empty intersections of toggle ranges, or both.

In operation 1030, reduced toggle ranges for the each of the test cubes are determined by combining the chain-reduced toggle ranges based on the predetermined toggle rate for the hold-toggle pattern. According to some embodiments of the disclosed technology, the scan chains are first sorted in ascending order based on the number of chain-reduced toggle ranges for each of the scan chains. Starting from a scan chain with the smallest number of the chain-reduced toggle ranges, the chain-reduced toggle ranges are combined one scan chain at a time until the number of derived reduced toggle ranges becomes greater than the toggle points allowed by the predetermined toggle rate for the hold-toggle pattern (every reduced toggle range is eventually represented by a single toggle point). If the chain-reduced toggle ranges for a scan chain cannot be merged because of the predetermined toggle rate for the hold-toggle pattern, a next chain will be examined until all of the scan chains have been examined.

Figure 11:
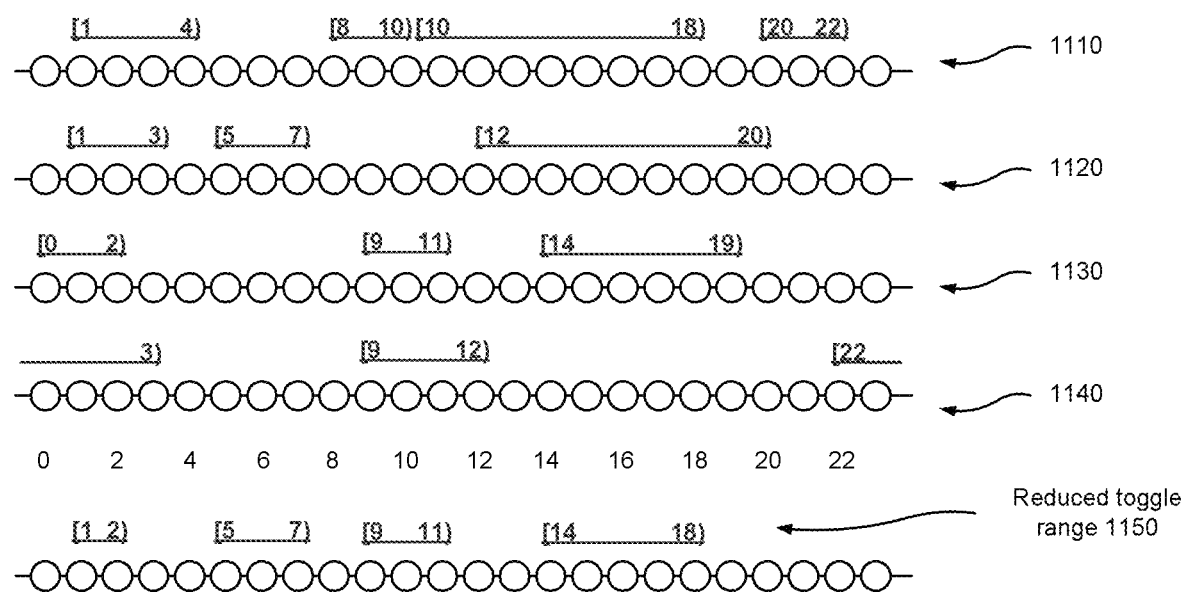
FIG. 11 illustrates an example of combining chain-reduced toggle ranges into reduced toggle ranges.

FIG. 11 illustrates an example of combining the chain-reduced toggle ranges into the reduced toggle ranges. The figure shows a group of chain-reduced toggle ranges for each of four scan chains 1110, 1120, 1130 and 1140. As can be seen in the figure, the scan chains 1110, 1120, 1130 and 1140 have 4, 3, 3, and 2 chain-reduced toggle ranges, respectively. In this example, the hold-toggle pattern has 24 bits, and the number of toggle points allowed by the predetermined toggle rate for the hold-toggle pattern is 4. The combination of the three scan chains 1140, 1130 and 1120 generate four reduced toggle ranges 1150. Here, [1, 2), [9, 11), and [14, 18) are obtained by computing intersections of the chain-reduced toggle ranges while [5, 7) is a chain-reduced toggle range for the scan chain 1120 which has no overlap with the other chain-reduced toggle ranges. The chain-reduced toggle ranges for the scan chain 1110, however, cannot be combined with the chain-reduced toggle range for the scan chain 1120 because it would result in an additional chain-reduced toggle range [20, 22), exceeding the maximum number of toggle points. Thus, the scan chain 1110 is designated as a full-toggle scan chain candidate. A scan chain itself having chain-reduced toggle ranges more than the maximum number of toggle points may also be a full-toggle scan chain candidate.

In operation 1040, the full-toggle scan chains are determined based on the full-toggle scan chain candidates (scan chains of which the chain-reduced toggle ranges cannot be combined into the reduced toggle ranges due to the predetermined toggle rate for the hold-toggle pattern) and the predetermined maximum number of device inputs for full-toggle scan chains. Various processes can be employed for determining the full-toggle scan chains. For example, the process may be based on identifying the smallest number of the device inputs for feeding (e.g., through 3-input XOR gates in a phase shifter) full-toggle scan chains. This is equivalent to solving a maximum covering problem. It should be noted that in some cases where no full-toggle scan chain candidates are found in either of the operations 1020 and 1030, the operation 1040 do not need to be performed.

Figure 12:
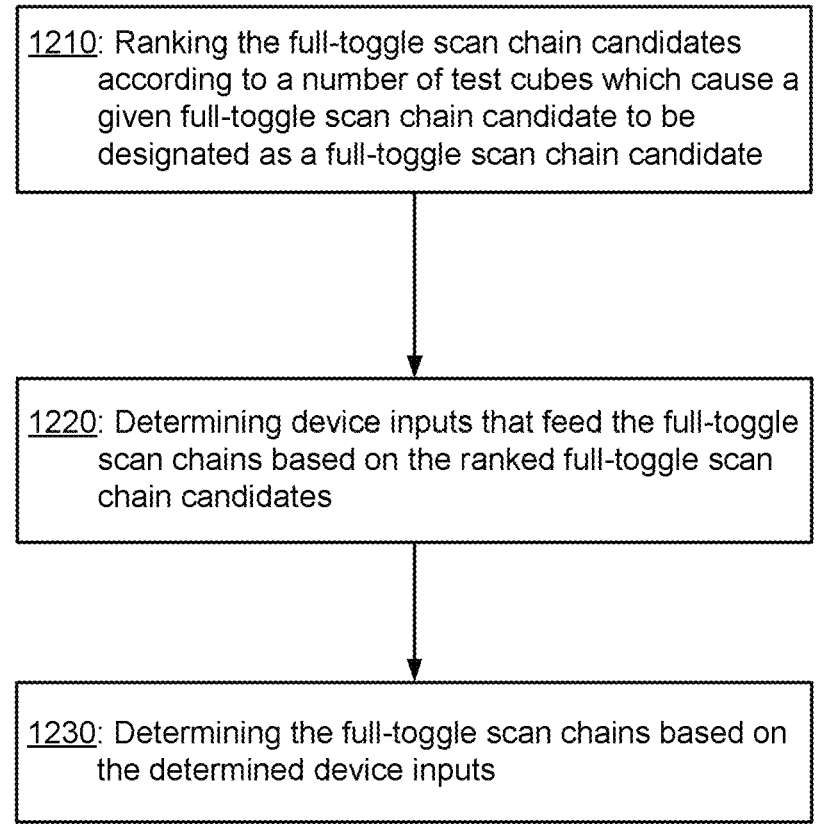
FIG. 12 illustrates a flowchart showing an example of a process for determining the full-toggle scan chains that may be implemented according to various examples of the disclosed technology.

FIG. 12 illustrates a flowchart 1200 showing an example of a process for determining the full-toggle scan chains that may be implemented for the operation 1040 according to various examples of the disclosed technology. In operation 1210, the full-toggle scan chain candidates are ranked in descending order according to the number of test cubes which cause a given full-toggle scan chain candidate to be designated as a full-toggle scan chain candidate. The more test cubes a full-toggle scan chain candidate is associated with, the better chance these test cubes can be encoded together along with the test cubes for which no full-toggle scan chain is needed.

In operation 1220, device inputs associated with the full-toggle scan chains are determined based on the ranked full-toggle scan chain candidates. This may start with identifying device inputs for the highest ranked full-toggle scan chain candidate. If the scan chains are driven by 3-input XOR gates, there can be three such device inputs for the highest ranked full-toggle scan chain candidate. Some of the next highest ranked full-toggle scan chain candidates may share one or more of the identified device inputs with the highest ranked full-toggle scan chain candidate or provide additional or better device input candidates. The operation 1220 keeps trying different full-toggle scan chain candidates to maximize the number of faults (or test cubes) that can be detected until there are no more than predetermined maximum number of device inputs for full-toggle scan chains available.

Figure 13:
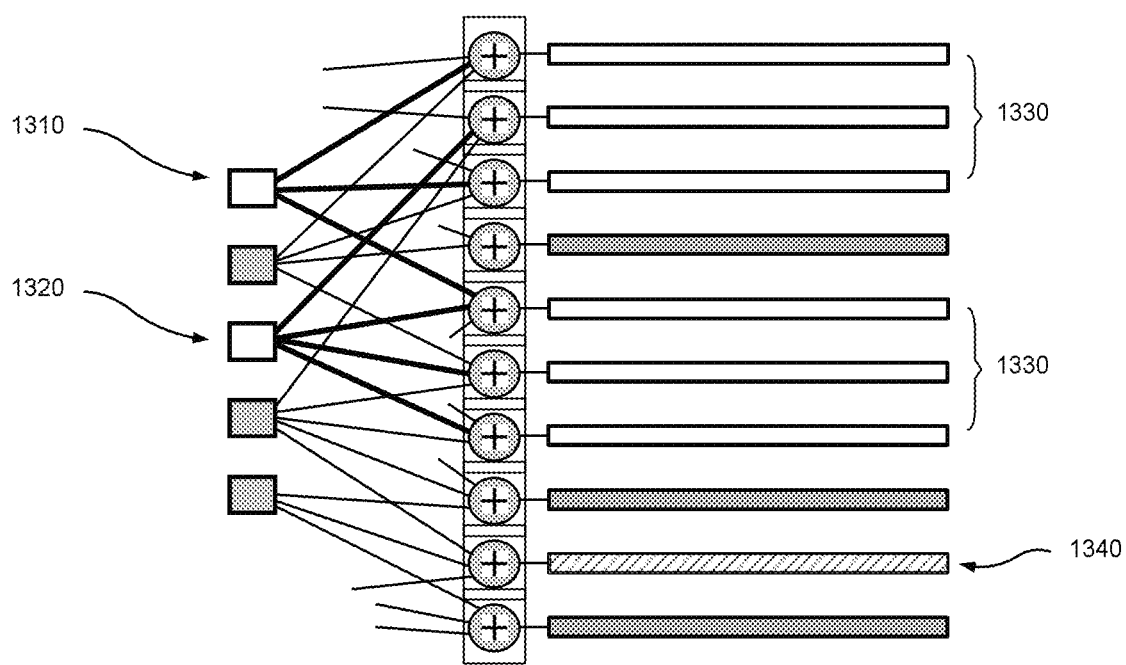
FIG. 13 illustrates an example of a block diagram of a system comprising device inputs, XOR gates and scan chains.

In operation 1230, the full-toggle scan chains are determined based on the device inputs determined in the previous operation. The full-toggle scan chains are scan chains served by these device inputs. The test cubes whose full-toggle scan chain candidates cannot be served by the selected device inputs are returned to the pool of test cubes to be used in next iterations. FIG. 13 illustrates an example of a block diagram of a system comprising device inputs, XOR gates and scan chains which is used to describe the operation 1230. In the figure, device inputs 1310 and 1320 are selected for feeding the full-toggle scan chains. The device inputs 1310 and 1320 contribute to the data loaded into scan chains 1330, which are thus the full-toggle scan chains. Scan chain 1340 is a full-toggle scan chain candidate for a particular test cube. This particular test cube is removed from the present iteration of test pattern generation because the scan chain 1340 is not selected to be a full-toggle scan chain. Scan chains other than the scan chains 1330 and 1340 shown in the figure are hold-toggle scan chain candidates. Assume that the total number of the scan chains is 960 and that the device coupled to the scan chains has 32 device inputs, 960 outputs, and 3-input XOR gates in between. One device input is selected to serve the full-toggle scan chains. As such, the number of the full-toggle scan chains can reach 90.

Figure 14:
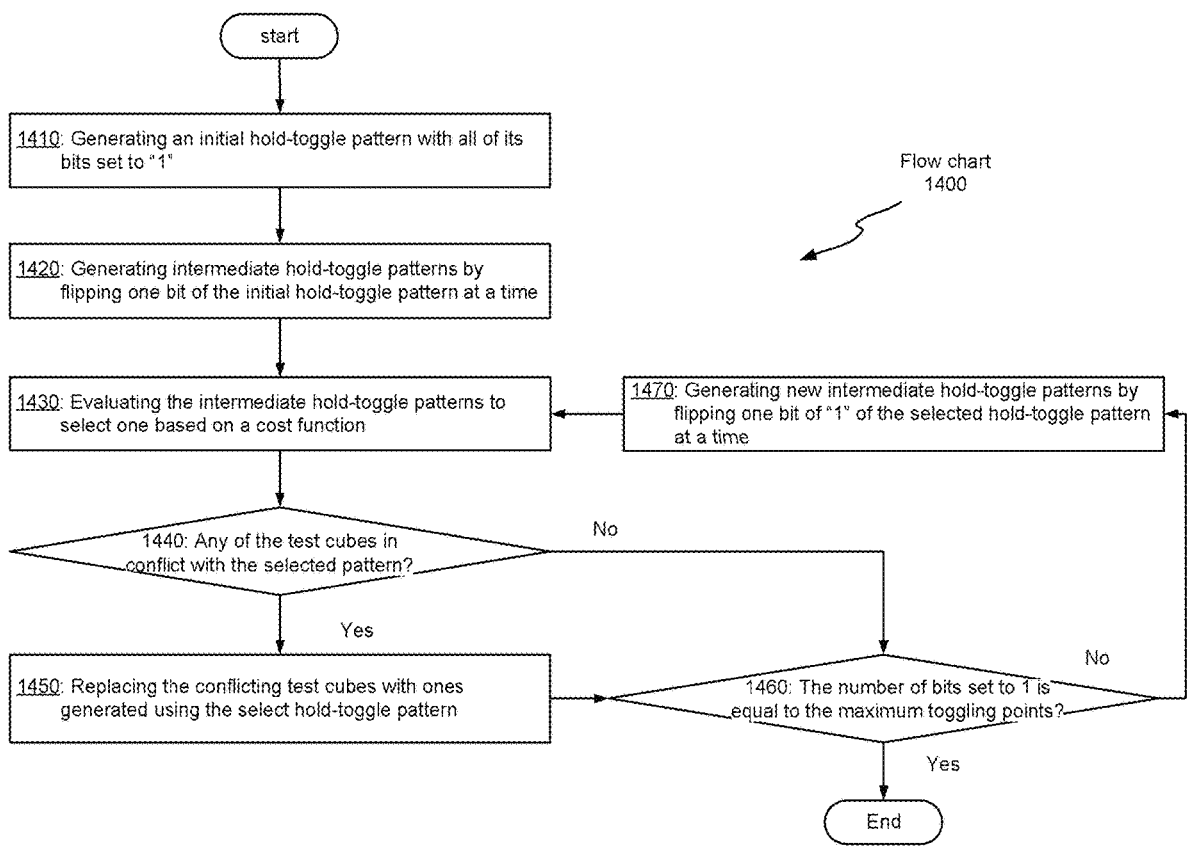
FIG. 14 illustrates a flowchart showing an example of a process for determining the hold-toggle pattern that may be implemented according to various examples of the disclosed technology.
Figure 15:
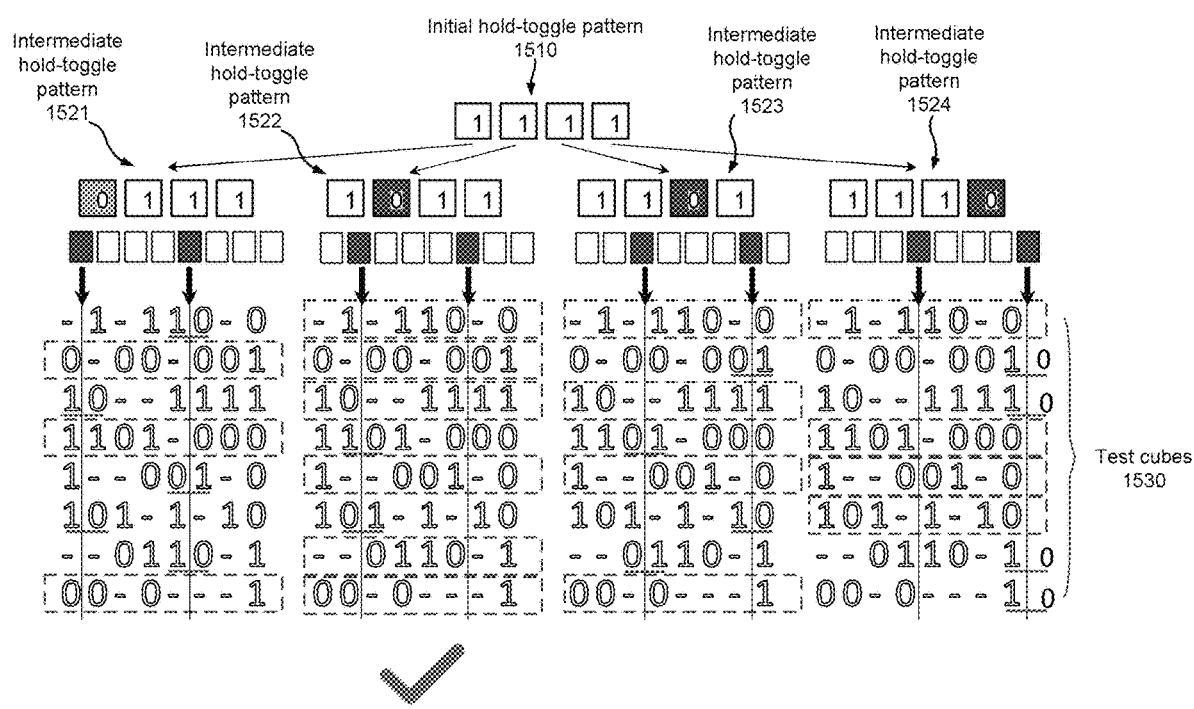
FIG. 15 illustrates an example of the first iteration in a relaxation algorithm-based process for determining the hold-toggle pattern according to some embodiments of the disclosed technology.

Refer back to the flowchart 800. After the full-toggle scan chains are determined, in operation 820, the hold-toggle pattern is determined using a relaxation algorithm and based on the full-toggle scan chains, the plurality of test cubes, and the predetermined size and toggle rate for the hold-toggle pattern. FIG. 14 illustrates a flowchart 1400 showing an example of a process for determining the hold-toggle pattern that may be implemented for the operation 820 according to various examples of the disclosed technology. In operation 1410, an initial hold-toggle pattern with all of its bits equal to "1" and with its size equal to the predetermined size for the hold-toggle pattern is generated. With no "0" bit in the initial hold-toggle pattern, the hold-toggle scan chains would operate just like the full-toggle scan chains. In operation 1420, a plurality of intermediate hold-toggle patterns are generated with all available "1" bits of the initial hold-toggle pattern being flipped once, respectively. As a result, each of the plurality of intermediate hold-toggle patterns differs from the initial hold-toggle patterns by one bit.

In operation 1430, the plurality of intermediate hold-toggle patterns are evaluated to select the highest ranked intermediate hold-toggle pattern based on a cost function. The cost function can measure, for example, how many more bits can be encoded for test compression. The cost function may be associated with a difference G between the original number of a test cube's specified bits and the number of specified bits that need to be encoded after a bit flipping. For the EDT encoding, the latter number represents just the leading specified bits of every hold segment. If a test cube cannot be encoded anymore (a deleted toggling point has been separating two cells with the opposite values), its previous gain L needs to be retrieved from the last iteration. The highest ranked intermediate hold-toggle pattern may thus correspond to the largest value of $\Sigma G - \Sigma L$.

In operation 1440, the present test cubes are analyzed to determine whether they have conflict with the highest ranked intermediate hold-toggle pattern. If some do, in operation 1450, these test cubes are dropped from consideration and the vacated positions are filled with new test cubes generated under the current highest ranked intermediate hold-toggle pattern. In operation 1460, the number of bits set to 1 in the current highest ranked intermediate hold-toggle pattern is compared with the maximum toggling points dictated by the predetermined size for the hold-toggle pattern. If the answer is equal, then the relaxation process can be terminated and the current highest ranked intermediate hold-toggle pattern becomes the hold-toggle pattern. Otherwise, in operation 1470, a plurality of new intermediate hold-toggle patterns are generated with all available "1" bits of the current highest ranked intermediate hold-toggle pattern being flipped once, respectively. Then the operations 1430-1460 are performed again.

IG. 15 illustrates an example of a first iteration in a relaxation algorithm-based process for determining the hold-toggle pattern according to some embodiments of the disclosed technology. An initial hold-toggle pattern 1510 has four bits, all being set to be "1". By flipping one bit at a time, four intermediate hold-toggle patterns 1521, 1522, 1523 and 1524 are generated. There are eight test cubes 1530, of which three, six, four and four test cubes (indicated by dotted rectangles) have no conflicts with the intermediate hold-toggle patterns 1521, 1522, 1523 and 1524, respectively. Apparently, the intermediate hold-toggle pattern 1522 will allow more specific bits to be encoded and is selected. Not every test cube conforms to the intermediate hold-toggle pattern 1522, however. The fourth and sixth test cubes from top are removed for the next round of pattern generation and replaced with two test cubes generated based on the intermediate hold-toggle pattern 1522.

Figure 16:
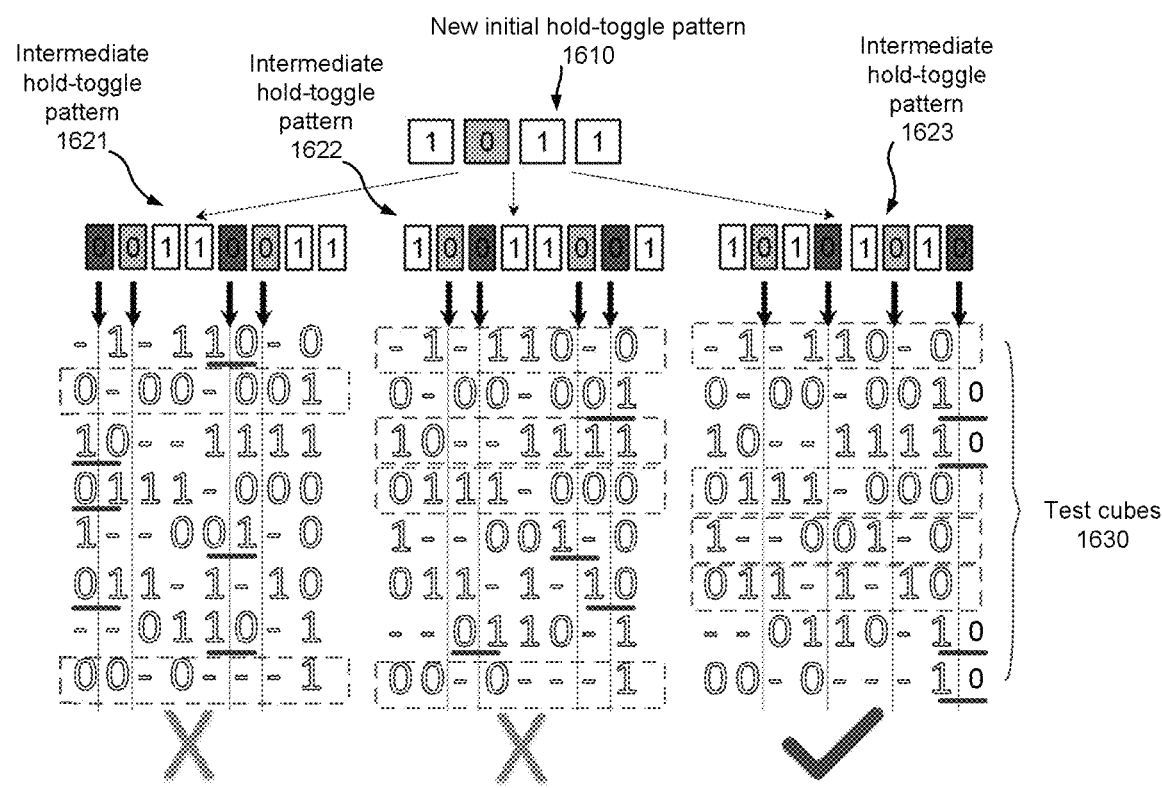
FIG. 16 illustrates an example of the second iteration in a relaxation algorithm-based process for determining the hold-toggle pattern according to some embodiments of the disclosed technology.

The predetermined toggle rate for the hold-toggle pattern is assumed to be 50% for the above example. Therefore, another iteration of the relaxation algorithm for determining the hold-toggle pattern can be performed. FIG. 16 illustrated an example of the second iteration according to some embodiments of the disclosed technology. The new initial hold-toggle pattern 1610 (the selected intermediate hold-toggle patterns 1522 in the last iteration) has three bits set to be "1". Accordingly, three new intermediate hold-toggle patterns 1621, 1622 and 1623 are generated. Here, each of three new intermediate hold-toggle patterns 1621, 1622 and 1623 are shown to repeat once to match the size of test cubes 1630. Another way to do it is to derive chain-reduced toggle ranges or reduced toggle ranges for each of the test cubes, as explained previously. A direct comparison of the test cubes 1630 with the intermediate hold-toggle patterns 1621, 1622 and 1623 shows that six of the test cubes are in conflict with the intermediate hold-toggle pattern 1621 and four of the test cubes are in conflict with either of the intermediate hold-toggle patterns 1622 and 1623. A further analysis shows that the intermediate hold-toggle pattern 1623 can encode more specified bits and thus is selected. Now, half of the bits of the selected intermediate hold-toggle pattern 1623 are "0" and the relaxation process can be terminated. The hold-toggle pattern is "1010".

Figure 17:
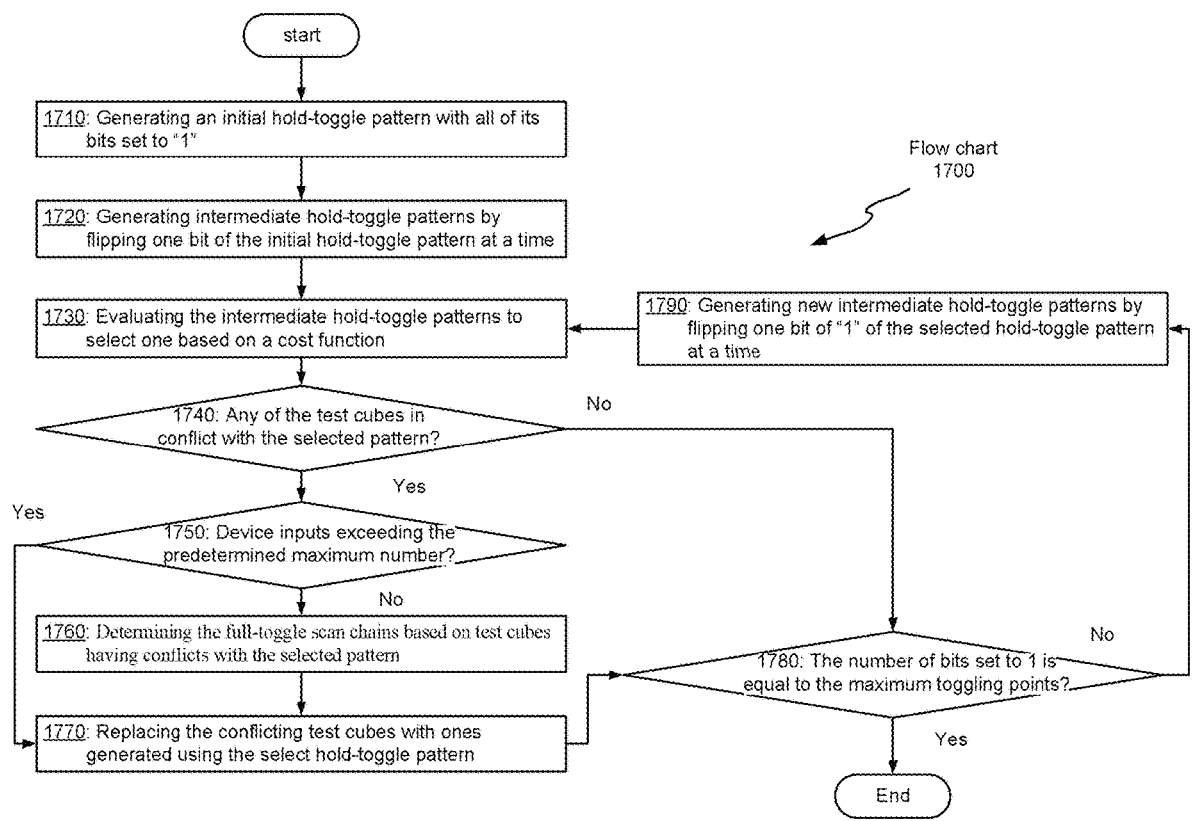
FIG. 17 illustrates a flowchart showing an example of a process for determining the hold-toggle pattern and the full-toggle scan chains together that may be implemented for according to various examples of the disclosed technology.

FIG. 8 shows an example of a process that determines full-toggle scan chains first and then the hold-toggle pattern based on the full-toggle scan chains. Alternatively, the hold-toggle pattern may be determined first or concurrently with the determination of full-toggle scan chains. FIG. 17 illustrates a flowchart 1700 showing an example of a process for determining the hold-toggle pattern and the full-toggle scan chains together that may be implemented for the operation 720 of the flow chart 700 according to various examples of the disclosed technology. In operation 1710, an initial hold-toggle pattern with all of its bits equal to "1" and with its size equal to the predetermined size for the hold-toggle pattern is generated. With no "0" bit in the initial hold-toggle pattern, the hold-toggle scan chains would operate just like the full-toggle scan chains. In operation 1720, a plurality of intermediate hold-toggle patterns are generated with all available "1" bits of the initial hold-toggle pattern being flipped once, respectively. As a result, each of the plurality of intermediate hold-toggle patterns differs from the initial hold-toggle patterns by one bit.

In operation 1730, the plurality of intermediate hold-toggle patterns are evaluated to select the highest ranked intermediate hold-toggle pattern based on a cost function.

The cost function can measure, for example, how many more bits can be encoded for test compression. The cost function may be associated with a difference G between the original number of a test cube's specified bits and the number of specified bits that need to be encoded after a bit flipping. For the EDT encoding, the latter number represents just the leading specified bits of every hold segment. If a test cube cannot be encoded anymore (a deleted toggling point has been separating two cells with the opposite values), its previous gain L needs to be retrieved from the last iteration. The highest ranked intermediate hold-toggle pattern may thus correspond to the largest value of $\Sigma G - \Sigma L$.

In operation 1740, the present test cubes are analyzed to determine whether they have conflict with the highest ranked intermediate hold-toggle pattern. If some do, in operation 1750, the number of device inputs used by already determined full-toggle scan chains is checked to see whether it exceeds the predetermined maximum number of device inputs. If the answer is yes, scan chains associated with the test cubes in conflict with the selected intermediate hold-toggle pattern will serve as full-toggle scan chain candidates, and the full-toggle scan chains will be determined based on the full-toggle scan chain candidates in operation 1760. After some or all of the full-toggle scan chains are determined, the test cubes may be "shortened" or "reduced" by removing bits associated with these full-toggle scan chains. Some of the test cubes originally in conflict with the selected intermediate hold-toggle pattern may now conform to it. Those that are still in conflict with the selected intermediate hold-toggle pattern will be replaced with test cubes generated based on the selected intermediate hold-toggle pattern in operation 1770.

If the present test cubes have no conflict with the highest ranked intermediate hold-toggle pattern, whether the number of bits set to 1 is equal to the maximum toggling points is determined in operation 1780. If the answer is yes, the iteration is terminated and the current highest ranked intermediate hold-toggle pattern becomes the hold-toggle pattern. Otherwise, in operation 1790, a plurality of new intermediate hold-toggle patterns are generated with all available "1" bits of the current highest ranked intermediate hold-toggle pattern being flipped once, respectively. Then the operations 1730-1790 are performed again. The flow chart 1700 is similar to the flow chart 1400 shown in FIG. 14 except for two additional operations 1750 and 1760 and their related operations.

Refer back to the flow chart 700 in FIG. 7. In operation 730, test patterns are generated based on the operational mode information and the hold-toggle pattern. Again, a commercial ATPG tool, such as those in the Tessent family of software tools available from Mentor Graphics Corporation, Wilsonville, Oreg., can be used to generate the test patterns. The operational mode information and the hold-toggle pattern can be used as added constraints in the process. The operational mode information and the hold-toggle pattern can also be used for ATPG guidance. The ATPG guidance comprises guiding ATPG decisions such as the ones on which signal paths to choose, faults ordering, or both. The generating test patterns may comprise generating compressed test patterns such as generating EDT-encoded patterns. In operation 740, fault simulations are performed on the generated test patterns to determine, based on whether there are still faults left in the originally target faults not detectable by the test patterns, whether to repeat the operations 710-740.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
    generating a test cube for each of a plurality of faults to obtain a plurality of test cubes;
    determining operational mode information and a hold-toggle pattern based on the plurality of test cubes, predetermined size and toggle rate for the hold-toggle pattern, and a predetermined maximum number of device inputs for full-toggle scan chains (scan chains operating in a full-toggle mode), wherein the operational mode information determines which scan chains in the scan chains to be the full-toggle scan chains and which scan chains in the scan chains to be hold-toggle scan chains (scan chains operating in a hold-toggle mode) during a shift period, wherein the hold-toggle pattern determines in which shift clock cycles in a segment of consecutive shift clock cycles the hold-toggle scan chains receive bits based on corresponding bits of a test pattern during the shift period, wherein the hold-toggle pattern repeats multiple times during the shift period, the shift period being a period when the test pattern is being shifted into scan chains, and wherein the device inputs are inputs of a device coupled to the scan chains and configured to allow a small number of input lines to feed a large number of the scan chains; and
    generating test patterns based on the operational mode information and the hold-toggle pattern.

2. The method recited in claim 1, further comprising:
    performing fault simulations to determine, based on whether there are still faults left in originally targeted faults not detectable by the test patterns, whether to repeat the generating test cubes, the determining operational mode information and a hold-toggle pattern, and the generating test patterns.

3. The method recited in claim 1, wherein the determining operational mode information and a hold-toggle pattern comprises:
    determining the full-toggle scan chains based on toggle ranges for each of the plurality of test cubes; and
    determining the hold-toggle pattern using a relaxation algorithm and based on the full-toggle scan chains, the plurality of test cubes, and the predetermined size and toggle rate for the hold-toggle pattern.

4. The method recited in claim 3, wherein the determining the full-toggle scan chains comprises:
    determining the toggle ranges for each of the scan chains for the each of the test cubes;
    determining chain-reduced toggle ranges by combining the toggle ranges for each of the scan chains for the each of the test cubes based on the predetermined size for the hold-toggle pattern;

determining reduced toggle ranges for the each of the test cubes by combining the chain-reduced toggle ranges based on the predetermined toggle rate for the hold-toggle pattern; and determining the full-toggle scan chains based on scan chains of which the chain-reduced toggle ranges cannot be combined into the reduced toggle ranges due to the predetermined toggle rate for the hold-toggle pattern and the number of device inputs available for full-toggle scan chains.

5. The method recited in claim 1, wherein the determining operational mode information and a hold-toggle pattern comprises:

determining the hold-toggle pattern using a relaxation algorithm and based on the plurality of test cubes and the predetermined size and toggle rate for the hold-toggle pattern.

6. The method recited in claim 5, wherein the determining the hold-toggle pattern comprises:

replacing test cubes having conflicts with a selected intermediate hold-toggle pattern generated by the relaxation algorithm with test cubes generated based on the selected intermediate hold-toggle pattern.

7. The method recited in claim 5, wherein the determining operational mode information and a hold-toggle pattern further comprises:

determining the full-toggle scan chains based on test cubes having conflicts with an intermediate hold-toggle pattern selected by the relaxation algorithm and the number of device inputs available for full-toggle scan chains.

8. The method recited in claim 7, wherein the determining the full-toggle scan chains comprises:

ranking scan chains based on the test cubes having conflicts with the selected intermediate hold-toggle pattern; and using the ranked scan chains and the number of device inputs available for full-toggle scan chains to determine the full-toggle scan chains.

9. The method recited in claim 5, wherein the determining the hold-toggle pattern comprises:

selecting an intermediate hold-toggle pattern from intermediate hold-toggle patterns generated by the relaxation algorithm based on a specified bits-related cost function.

10. The method recited in claim 1, wherein the device is an expander in a decompressor.

11. The method recited in claim 1, wherein the generating test patterns comprises generating compressed test patterns.

12. The method recited in claim 11, wherein the compressed test patterns are test patterns encoded for EDT (embedded deterministic test)-based decompressors.

13. The method recited in claim 1, wherein the predetermined size for the hold-toggle pattern is 40 bits or fewer, the predetermined toggle rate for the hold-toggle pattern is two times the scan chain shift toggle rate limit, and the predetermined maximum number of device inputs for the full-toggle scan chains is 2.

14. The method recited in claim 1, wherein the plurality of faults are a subset of originally targeted faults.

15. One or more non-transitory computer-readable media storing computer-executable instructions for causing one or more processors to perform a method, the method comprising:

generating a test cube for each of a plurality of faults to obtain a plurality of test cubes;

determining operational mode information and a hold-toggle pattern based on the plurality of test cubes, predetermined size and toggle rate for the hold-toggle pattern, and a predetermined maximum number of device inputs for full-toggle scan chains (scan chains operating in a full-toggle mode), wherein the operational mode information determines which scan chains in the scan chains to be the full-toggle scan chains and which scan chains in the scan chains to be hold-toggle scan chains (scan chains operating in a hold-toggle mode) during a shift period, wherein the hold-toggle pattern determines in which shift clock cycles in a segment of consecutive shift clock cycles the hold-toggle scan chains receive bits based on corresponding bits of a test pattern during the shift period, wherein the hold-toggle pattern repeats multiple times during the shift period, the shift period being a period when the test pattern is being shifted into scan chains, and wherein the device inputs are inputs of a device coupled to the scan chains and configured to allow a small number of input lines to feed a large number of the scan chains; and generating test patterns based on the operational mode information and the hold-toggle pattern.

16. The one or more non-transitory computer-readable media recited in claim 15, wherein the method further comprises:

performing fault simulations to determine, based on whether there are still faults left in originally targeted faults not detectable by the test patterns, whether to repeat the generating test cubes, the determining operational mode information and a hold-toggle pattern, and the generating test patterns.

17. The one or more non-transitory computer-readable media recited in claim 15, wherein the determining operational mode information and a hold-toggle pattern comprises:

determining the full-toggle scan chains based on toggle ranges for each of the plurality of test cubes; and determining the hold-toggle pattern using a relaxation algorithm and based on the full-toggle scan chains, the plurality of test cubes, and the predetermined size and toggle rate for the hold-toggle pattern.

18. The one or more non-transitory computer-readable media recited in claim 17, wherein the determining the full-toggle scan chains comprises:

determining the toggle ranges for each of the scan chains for the each of the test cubes;

determining chain-reduced toggle ranges by combining the toggle ranges for each of the scan chains for the each of the test cubes based on the predetermined size for the hold-toggle pattern;

determining reduced toggle ranges for the each of the test cubes by combining the chain-reduced toggle ranges based on the predetermined toggle rate for the hold-toggle pattern; and determining the full-toggle scan chains based on scan chains of which the chain-reduced toggle ranges cannot be combined into the reduced toggle ranges due to the predetermined toggle rate for the hold-toggle pattern and the number of device inputs available for full-toggle scan chains.

19. The one or more non-transitory computer-readable media recited in claim 15, wherein the determining operational mode information and a hold-toggle pattern comprises:

determining the hold-toggle pattern using a relaxation algorithm and based on the plurality of test cubes and the predetermined size and toggle rate for the hold-toggle pattern.

20. The one or more non-transitory computer-readable media recited in claim 19, wherein the determining the hold-toggle pattern comprises:

replacing test cubes having conflicts with a selected intermediate hold-toggle pattern generated by the relaxation algorithm with test cubes generated based on the selected intermediate hold-toggle pattern.

21. The one or more non-transitory computer-readable media recited in claim 19, wherein the determining operational mode information and a hold-toggle pattern further comprises:

determining the full-toggle scan chains based on test cubes having conflicts with an intermediate hold-toggle pattern selected by the relaxation algorithm and the number of device inputs available for full-toggle scan chains.

22. The one or more non-transitory computer-readable media recited in claim 21, wherein the determining the full-toggle scan chains comprises:

ranking scan chains based on the test cubes having conflicts with the selected intermediate hold-toggle pattern; and using the ranked scan chains and the number of device inputs available for full-toggle scan chains to determine the full-toggle scan chains.

23. The one or more non-transitory computer-readable media recited in claim 19, wherein the determining the hold-toggle pattern comprises:

selecting an intermediate hold-toggle pattern from intermediate hold-toggle patterns generated by the relaxation algorithm based on a specified bits-related cost function.

24. The one or more non-transitory computer-readable media recited in claim 15, wherein the device is an expander in a decompressor.

25. The one or more non-transitory computer-readable media recited in claim 15, wherein the generating test patterns comprises generating compressed test patterns.

26. The one or more non-transitory computer-readable media recited in claim 25, wherein the compressed test patterns are test patterns encoded for EDT (embedded deterministic test)-based decompressors.

27. The one or more non-transitory computer-readable media recited in claim 15, wherein the predetermined size for the hold-toggle pattern is 40 bits or fewer, the predetermined toggle rate for the hold-toggle pattern is two times the scan chain shift toggle rate limit, and the predetermined maximum number of device inputs for the full-toggle scan chains is 2.

28. The one or more non-transitory computer-readable media recited in claim 15, wherein the plurality of faults are a subset of originally targeted faults.

* * * * *